(12) United States Patent
Sekiguchi

(10) Patent No.: US 11,211,281 B2
(45) Date of Patent: Dec. 28, 2021

(54) SUBSTRATE PROCESSING APPARATUS AND SUBSTRATE PROCESSING METHOD

(71) Applicant: Tokyo Electron Limited, Tokyo (JP)

(72) Inventor: Kenji Sekiguchi, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/707,051

(22) Filed: Dec. 9, 2019

(65) Prior Publication Data
US 2020/0185261 A1   Jun. 11, 2020

(30) Foreign Application Priority Data

Dec. 10, 2018 (JP) .............................. JP2018-230872

(51) Int. Cl.
| | |
|---|---|
| *H01L 21/68* | (2006.01) |
| *H01L 21/687* | (2006.01) |
| *H01L 21/67* | (2006.01) |
| *H01L 21/02* | (2006.01) |
| *H01L 21/306* | (2006.01) |

(52) U.S. Cl.
CPC .. *H01L 21/68764* (2013.01); *H01L 21/02057* (2013.01); *H01L 21/30604* (2013.01); *H01L 21/6708* (2013.01); *H01L 21/67017* (2013.01); *H01L 21/67051* (2013.01); *H01L 21/68785* (2013.01)

(58) Field of Classification Search
CPC ......... H01L 21/68764; H01L 21/67017; H01L 21/6708; H01L 21/02057; H01L 21/30604; H01L 21/67103; H01L 21/67253; H01L 21/67248; H01L 21/67028; H01L 21/68728; H01L 21/67703; H01L 21/67715; H01L 21/67736; H01L 21/67075; H01L 21/68785; H01L 21/67051; H01J 37/32715
USPC ...................... 118/730; 134/104.2, 149, 902; 156/345.18, 345.55; 216/83
See application file for complete search history.

(56) References Cited

U.S. PATENT DOCUMENTS

| | | | |
|---|---|---|---|
| 2008/0070418 A1* | 3/2008 | Miyagi | ................. H01L 21/461 438/745 |
| 2016/0372340 A1* | 12/2016 | Takeaki | ............ H01L 21/67109 |

FOREIGN PATENT DOCUMENTS

JP     2014-187253 A     10/2014

\* cited by examiner

*Primary Examiner* — Rudy Zervigon
(74) *Attorney, Agent, or Firm* — Pearne & Gordon LLP

(57) ABSTRACT

A substrate processing apparatus includes a placing unit, a supply, an embankment and a moving mechanism. The placing unit is configured to place a substrate thereon. The supply is configured to supply a processing liquid onto the substrate placed on the placing unit. The embankment is disposed to surround the substrate placed on the placing unit to suppress an outflow of the processing liquid supplied onto the substrate from the substrate. The moving mechanism is configured to vary a height of the embankment.

17 Claims, 13 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2018-230872 filed on Dec. 10, 2018, the entire disclosure of which is incorporated herein by reference.

TECHNICAL FIELD BACKGROUND

The various aspects and embodiments described herein pertain generally to a substrate processing apparatus and a substrate processing method.

BACKGROUND

Conventionally, there is known a substrate processing method of processing a substrate such as semiconductor wafer by supplying, while rotating the substrate, a processing liquid such as an etching liquid onto a central portion of the substrate being rotated (see Patent Document 1).

Patent Document 1: Japanese Patent Laid-open Publication No. 2014-187253

SUMMARY

In one exemplary embodiment, a substrate processing apparatus includes a placing unit, a supply, an embankment and a moving mechanism. The placing unit is configured to place a substrate thereon. The supply is configured to supply a processing liquid onto the substrate placed on the placing unit. The embankment is disposed to surround the substrate placed on the placing unit to suppress an outflow of the processing liquid supplied onto the substrate from the substrate. The moving mechanism is configured to vary a height of the embankment.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
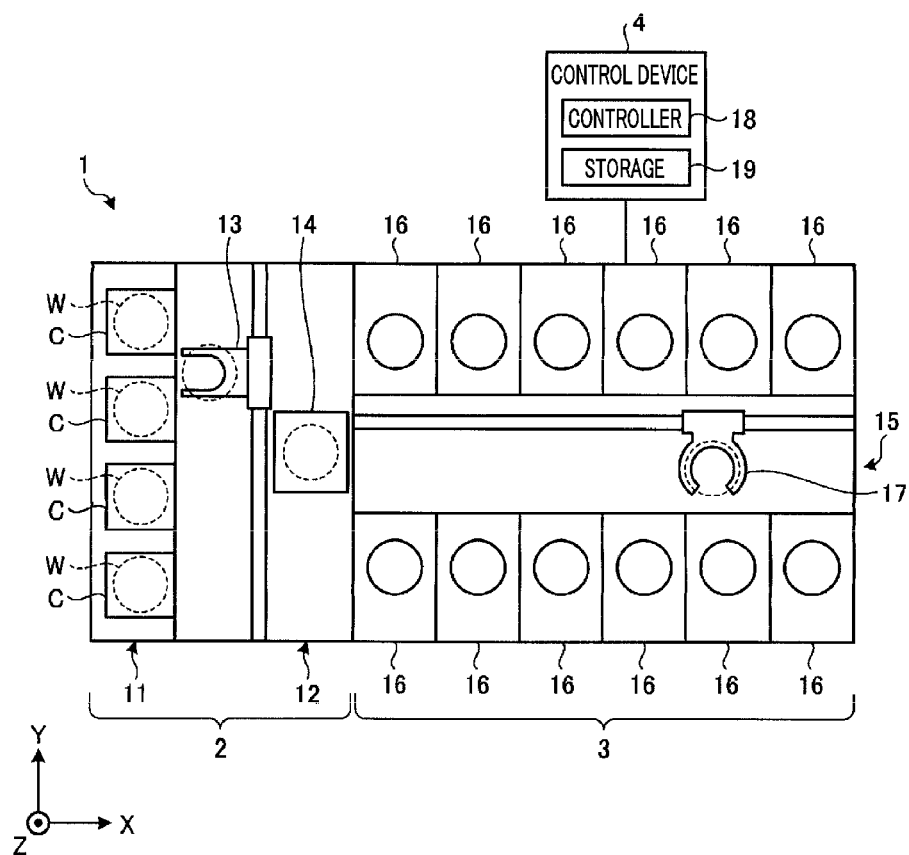
FIG. 1 is a diagram illustrating a configuration of a substrate processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a substrate processing method according to the present disclosure will be described in detail with reference to the accompanying drawings. However, the exemplary embodiments do not limit the substrate processing apparatus and the substrate processing method of the present disclosure. Further, the various exemplary embodiments can be appropriately combined as long as the contents of processings are not contradictory. Furthermore, in the various exemplary embodiments, same parts will be assigned same reference numerals, and redundant description will be omitted.

In the various drawings, for the convenience of explanation, the X-axis, Y-axis and Z-axis which are orthogonal to each other will be defined, and an orthogonal coordinates system where the positive Z-axis direction is set as a vertically upward direction may be used.

Recently, in a semiconductor manufacturing process, there is an increasing demand for a wet etching. Among various types of the wet etching, a single-substrate type wet etching is performed to process substrates one by one. This wet etching is performed by supplying, while rotating the substrate, an etching liquid onto a central portion of the substrate being rotated.

In the single-substrate type wet etching, an etching liquid heated to a preset temperature may be used to improve efficiency of the processing, for example. However, during a period until the heated etching liquid reaches a peripheral portion of the substrate after being supplied onto a central portion of the substrate, a temperature of the heated etching liquid is decreased due to heat absorption into the substrate or heat dissipation by evaporation heat. To elaborate, a temperature of the etching liquid at the peripheral portion of the substrate is lower than a temperature of the etching liquid at the central portion of the substrate. As the temperature of the etching liquid becomes non-uniform within a surface of the substrate, in-surface uniformity of the etching processing may be degraded.

In view of this, the substrate processing apparatus according to the present disclosure is designed to improve the in-surface uniformity of the etching processing by improving temperature uniformity of the etching liquid within the surface of the substrate.

First Exemplary Embodiment

First, a configuration of a substrate processing system according to a first exemplary embodiment will be explained with reference to FIG. 1. FIG. 1 is a diagram illustrating the configuration of the substrate processing system according to the first exemplary embodiment.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, carriers C each accommodating a plurality of substrates (semiconductor wafers in the present exemplary embodiment) (hereinafter, referred to as "wafers W") horizontally are placed.

The transfer section 12 is provided adjacent to the carrier placing section 11, and is equipped with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafer W between the carriers C and the delivery unit 14 by using the wafer holding mechanism.

The processing station 3 is provided adjacent to the transfer section 12. The processing station 3 is provided with a transfer section 15 and a plurality of processing units 16. The processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafer W between the delivery unit 14 and the processing units 16 by using the wafer holding mechanism.

The processing units 16 perform a predetermined substrate processing on the wafer W transferred by the substrate transfer device 17.

Further, the substrate processing system 1 is equipped with a control device 4. The control device 4 is, for example, a computer, and includes a controller 18 and a storage 19. The storage 19 stores therein a program that controls various processings performed in the substrate processing system 1. The controller 18 controls the operations of the substrate processing system 1 by reading and executing the program stored in the storage 19.

Further, the program may be recorded in a computer-readable recording medium and may be installed to the storage 19 of the control device 4 from this recording medium. The computer-readable recording medium may be, by way of non-limiting example, a hard disk (HD), a flexible disk (FD), a compact disk (CD), a magnet optical disk (MO), a memory card, or the like.

In the substrate processing system 1 configured as described above, the substrate transfer device 13 of the carry-in/out station 2 first takes out the wafer W from the carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into the processing unit 16.

The wafer W carried into the processing unit 16 is processed by the processing unit 16, and then taken out from the processing unit 16 and placed on the delivery unit 14 by the substrate transfer device 17. The wafer W placed on the delivery unit 14 is then returned back into the carrier C of the carrier placing section 11 by the substrate transfer device 13.

Figure 2:
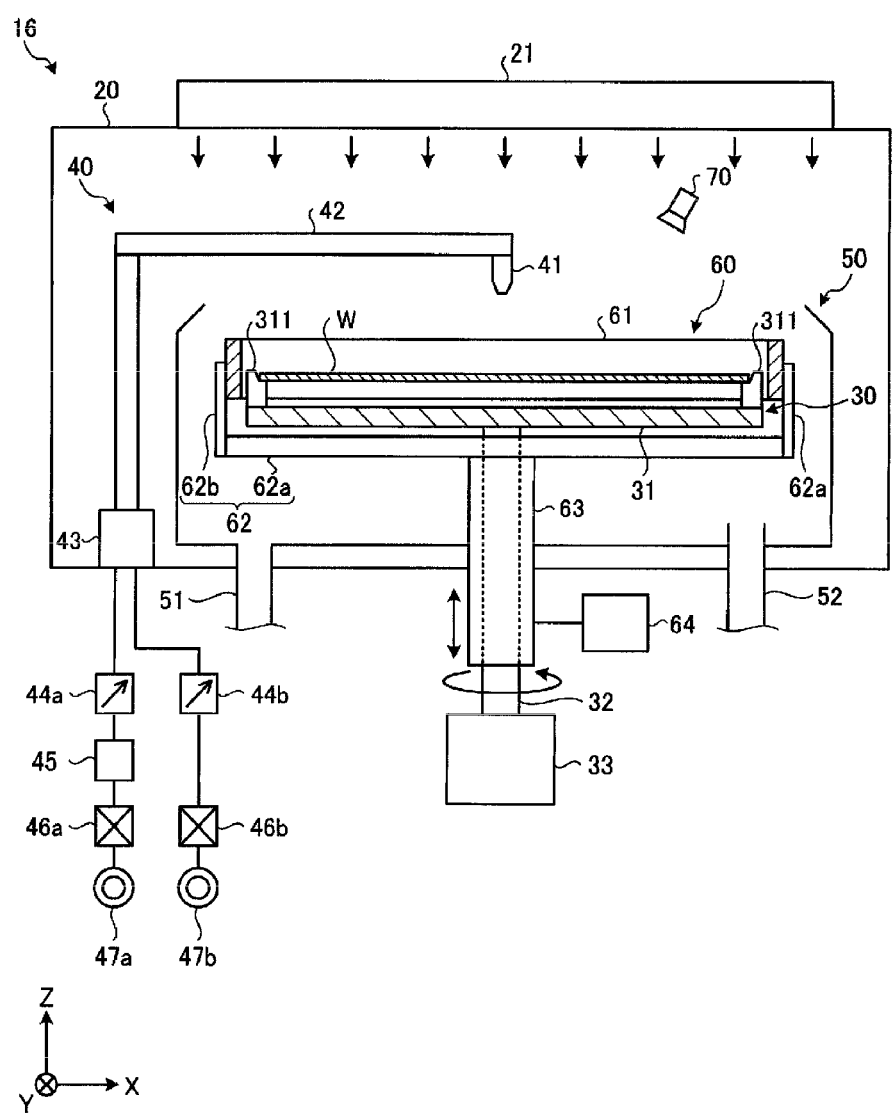
FIG. 2 is a diagram illustrating a configuration of a processing unit according to the first exemplary embodiment.
Figure 3:
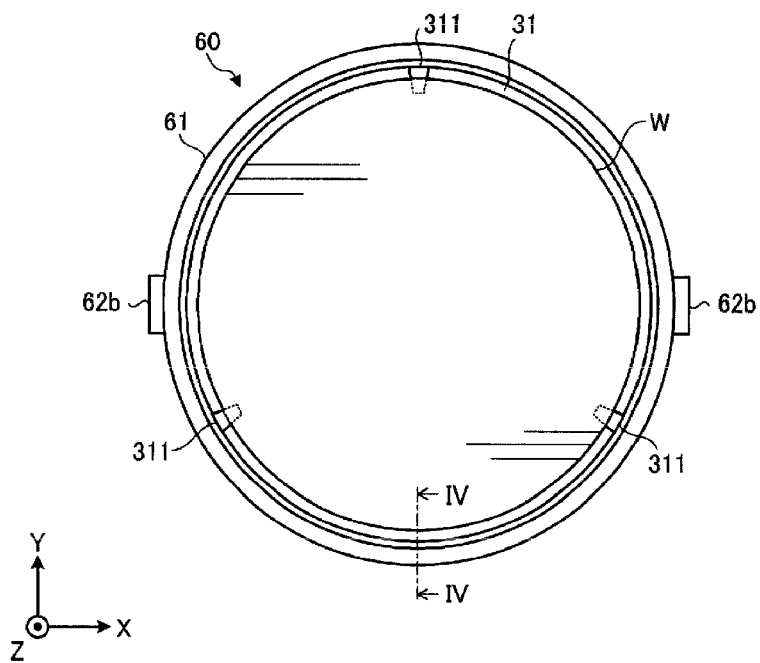
FIG. 3 is a diagram illustrating a configuration of an embankment mechanism according to the first exemplary embodiment.
Figure 4:
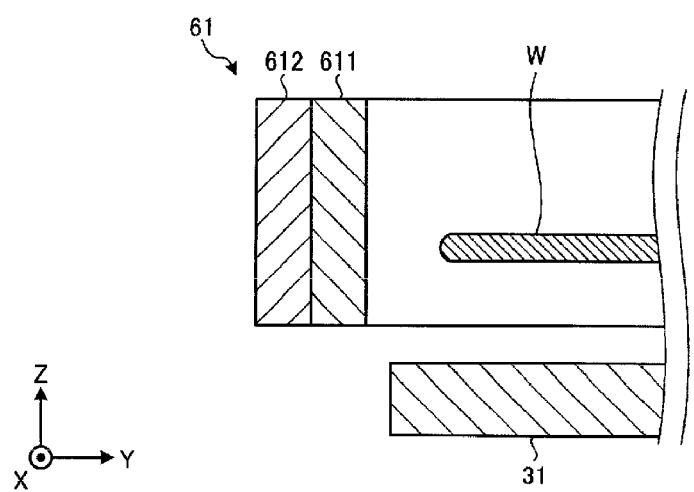
FIG. 4 is an example cross sectional view taken along a line IV-IV of FIG. 3 and seen from a direction indicated by arrows.

Now, a configuration of the processing unit 16 will be explained with reference to FIG. 2 to FIG. 4. FIG. 2 is a diagram illustrating a configuration of the processing unit 16 according to the first exemplary embodiment. FIG. 3 is a diagram illustrating a configuration of an embankment mechanism 60 according to the first exemplary embodiment. FIG. 4 is an example of a cross sectional view taken along a line IV-IV of FIG. 3 and seen from a direction indicated by arrows.

As depicted in FIG. 2, the processing unit 16 includes a chamber 20, a substrate holding mechanism 30, a supply 40, a recovery cup 50, the embankment mechanism 60 and a temperature detector 70.

The chamber 20 accommodates therein the substrate holding mechanism 30, the supply 40, the recovery cup 50, the embankment mechanism 60 and the temperature detector 70. A FFU (Fan Filter Unit) 21 is provided at a ceiling of the chamber 20. The FFU 21 creates a downflow within the chamber 20.

The substrate holding mechanism 30 is equipped with a rotary plate 31, a supporting column 32 and a driving unit 33. The rotary plate 31 is provided at a substantially central portion of the chamber 20. A plurality of supporting members 311 configured to support a periphery of the wafer W from below is provided on a top surface of the rotary plate 31. By being supported by the plurality of supporting members 311, the wafer W is horizontally placed while being slightly spaced apart from the rotary plate 31. Without being limited to this example, the supporting members 311 may be configured to hold the wafer W from the side.

The supporting column 32 is a vertically extending member. A base end of the supporting column 32 is rotatably supported by the driving unit 33, and the supporting column 32 supports the rotary plate 31 horizontally at a leading end thereof. The driving unit 33 is configured to rotate the supporting column 32 around a vertical axis.

In the substrate holding mechanism 30 having the above-described configuration, by rotating the supporting column 32 with the driving unit 33, the rotary plate 31 supported by the supporting column 32 is rotated, so that the wafer W placed on the rotary plate 31 is rotated. The wafer W is held on the rotary plate 31 by a negative pressure generated by this rotation.

The supply 40 is configured to supply various kinds of processing liquids onto the wafer W held by the substrate holding mechanism 30. The supply 40 is equipped with a nozzle 41, an arm 42 configured to support the nozzle 41 horizontally and a rotating/elevating mechanism 43 configured to rotate and elevate the arm 42.

The nozzle 41 is connected to an etching liquid source 47a via a flow rate controller 44a, a heater 45 and a valve 46a. An etching liquid supplied from the etching liquid source 47a is heated by the heater 45 to a preset temperature and then discharged onto a top surface of the wafer W from the nozzle 41. The etching liquid may be, by way of non-limiting example, HF (hydrofluoric acid), TMAH (tetramethylammonium hydroxide), or the like.

Further, the nozzle 41 is connected to a rinse liquid source 47b via a flow rate controller 44b and a valve 46b. For example, DIW (deionized water) is supplied from the rinse liquid source 47b as a rinse liquid.

The recovery cup 50 is disposed to surround the rotary plate 31, and is configured to collect the processing liquid scattered from the wafer W when the rotary plate 31 is rotated. A drain port 51 is formed at a bottom of the recovery cup 50, and the processing liquid collected by the recovery cup 50 is drained from the drain port 51 to the outside of the processing unit 16. Further, an exhaust port 52 is formed at the bottom of the recovery cup 50 to exhaust a gas supplied from the FFU 21 to the outside of the processing unit 16.

The embankment mechanism 60 is equipped with an embankment 61, a support 62, a supporting column 63 and a moving mechanism 64. As shown in FIG. 2 and FIG. 3, the embankment 61 is a cylindrical member, and is disposed around the rotary plate 31 to surround the wafer W placed on the rotary plate 31 within the recovery cup 50. The embankment 61 suppresses an outflow of the etching liquid from the wafer W after the etching liquid is supplied onto the wafer W. Further, a gap is provided between the embankment 61 and the rotary plate 31 to suppress interference therebetween.

As illustrated in FIG. 4, the embankment 61 has a dual structure in which a first member 611 and a second member 612 are provided. The first member 611 is a member which is disposed at an inner periphery of the embankment 61 and is in contact with the etching liquid when the etching liquid is supplied onto the wafer W. The second member 612 is a member which is disposed at an outer periphery of the embankment 61 and is in contact with the atmosphere.

Desirably, the first member 611 is made of a material having a high thermal conductivity as compared to the second member 612. As the first member 611 is made of the material having the high thermal conductivity, a temperature of the first member 611 which comes into contact with the etching liquid can be made to approach a temperature of the etching liquid early. If a state in which the temperature of the first member 611 is lower than the temperature of the etching liquid lasts longer, there may be generated a difference between a temperature of the etching liquid at a peripheral portion of the wafer W and a temperature of the etching liquid at a central portion of the wafer W. By setting the first member 611 to have the high thermal conductivity, such a difference can be suppressed.

Further, it is desirable that the second member 612 is made of a material having high heat insulation property, such as a heat insulator. As the second member 612 is made of the material having the high heat insulation property, heat of the embankment 61 heated by the etching liquid may not be released to the atmosphere. Thus, it is easy to maintain a temperature of the embankment 61 equal to the temperature of the etching liquid. Accordingly, a difference between the temperature of the etching liquid at the peripheral portion of the wafer W and the temperature of the etching liquid at the central portion of the wafer W, which might be caused by a temperature decrease of the embankment 61, can be suppressed.

The embankment 61 is not limited to having the dual structure as long as it includes the first member 611 and the second member 612. That is, the embankment 61 may have a multilayer structure including the first member 611 and the second member 612.

The support 62 is configured to support the embankment 61. To elaborate, the support 62 is equipped with, for example, a first supporting member 62a extending in the horizontal direction; and a second supporting member 62b extending in the vertical direction and configured to connect the embankment 61 and the first supporting member 62a. In this shown example, though the first supporting member 62a is disposed under the rotary plate 31, the first supporting member 62a may be disposed above the rotary plate 31. That is, the support 62 may be configured to support the embankment 61 from above.

The supporting column 63 is a vertically extending member and is configured to support the first supporting member 62a of the support 62 at a leading end thereof. The moving mechanism 64 moves the supporting column 63 in the vertical direction. In the present exemplary embodiment, though the supporting column 63 is a hollow member and the supporting column 32 is inserted into the supporting column 63, the supporting member 63 need not necessarily be configured to accommodate the supporting column 32 therein. By way of example, the supporting column 63 may be configured to support a portion of the first supporting member 62a other than a central portion thereof.

In this embankment mechanism 60, by moving the supporting column 63 in the vertical direction by using the moving mechanism 64, the support 62 supported by the supporting column 63 is moved in the vertical direction. Accordingly, the embankment mechanism 60 is capable of varying a height of the embankment 61. By way of example, the embankment mechanism 60 is capable of moving the embankment 61 between a position where the embankment 61 surrounds the wafer W and a position where the embankment 61 does not surround the wafer W. Here, the "position where the embankment 61 surrounds the wafer W" refers to a position where an upper end surface of the embankment 61 is higher than a top surface of the wafer W. Further, the "position where the embankment 61 does not surround the wafer W" refers to a position where the upper end surface of the embankment 61 is lower than the top surface of the wafer W.

The temperature detector 70 is disposed above the wafer W placed on the rotary table 31 within the chamber 20. The temperature detector 70 detects a temperature of the top surface of the wafer W and outputs a detection result to the controller 18.

The temperature detector 70 may be, by way of non-limiting example, an infrared ray sensor. To elaborate, the temperature detector 70 is equipped with a light receiving element which receives an infrared ray, and detects a temperature of an object within a target region by a non-contact method by receiving, with this liquid receiving element, the infrared ray radiated from the object within the target region. Here, the entire top surface of the wafer W placed on the rotary plate 31 is set to be the target region. However, the target region is not limited thereto as long as it includes the central portion and the peripheral portion of the wafer W at least.

Figure 5:
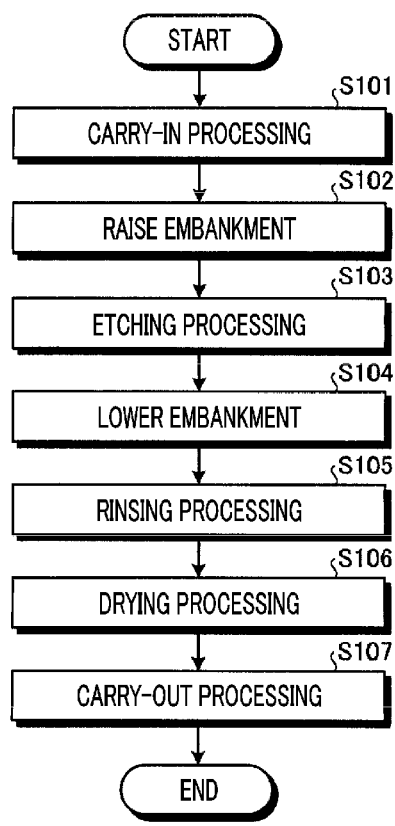
FIG. 5 is a flowchart illustrating a sequence of a substrate processing performed by the substrate processing system according to the first exemplary embodiment.

Here, specific operations of the substrate processing system 1 will be described with reference to FIG. 5 to FIG. 11. FIG. 5 is a flowchart illustrating a sequence of a substrate processing performed by the substrate processing system 1 according to the first exemplary embodiment. The individual components of the substrate processing system 1 perform processes shown in FIG. 5 under the control of the controller 18. FIG. 6 to FIG. 11 are diagrams for describing operations of the substrate processing according to the first exemplary embodiment.

As shown in FIG. 5, in the substrate processing system 1, a carry-in processing of carrying the wafer W into the processing unit 16 is first performed (process S101). To elaborate, the substrate transfer device 13 of the carry-in/out station 2 takes out the wafer W from the carrier C placed in the carrier placing section 11, and then places the taken wafer W on the delivery unit 14. Thereafter, the substrate transfer device 17 of the processing station 3 takes out the wafer W placed on the delivery unit 14 from the delivery unit 14 and then places the taken wafer W on the rotary plate 31 of the processing unit 16.

Figure 6:
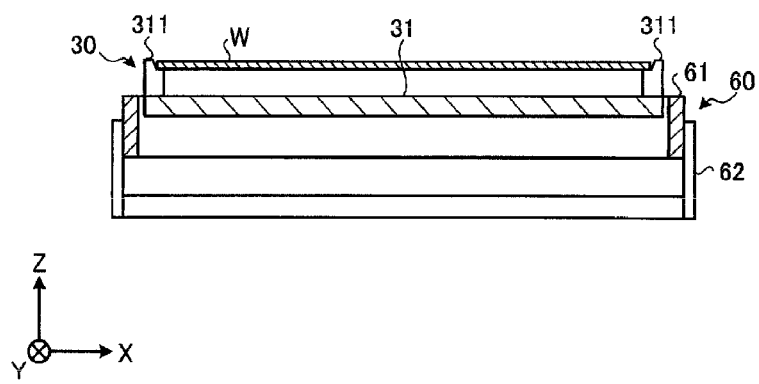
FIG. 6 is an explanatory diagram for describing an operation of the substrate processing according to the first exemplary embodiment.

As illustrated in FIG. 6, in the carry-in processing, the upper end surface of the embankment 61 is located at a position lower than the top surface of the wafer W supported by the supporting member 311. Accordingly, the wafer W can be suppressed from being hampered by the embankment 61 when the wafer W is carried in or out.

Figure 7:
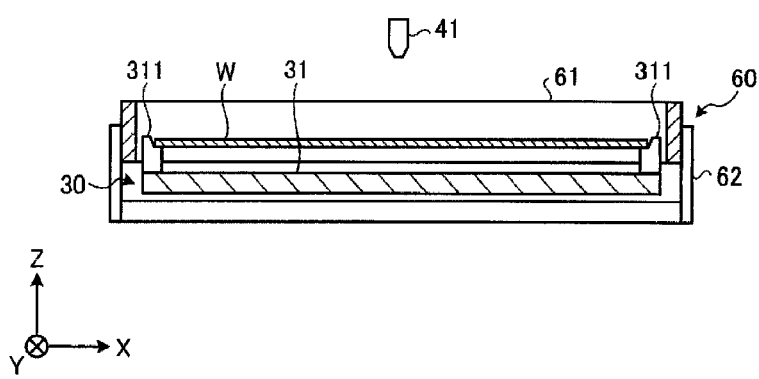
FIG. 7 is an explanatory diagram for describing an operation of the substrate processing according to the first exemplary embodiment.

Subsequently, in the substrate processing system 1, the controller 18 controls the moving mechanism 64 to move the embankment 61 upwards (process S102). Accordingly, the wafer W is surrounded by the embankment 61, as shown in FIG. 7. Further, as shown in FIG. 7, the controller 18 controls the rotating/elevating mechanism 43 to locate the nozzle 41 at a position above the central portion of the wafer W.

Thereafter, an etching processing is performed in the substrate processing system 1 (process S103). To be specific, the controller 18 controls the driving unit 33 to rotate the rotary plate 31, thus allowing the wafer W placed on the rotary plate 31 to be rotated. Further, the controller 18 opens the valve 46a for a preset time period, thus allowing the etching liquid supplied from the etching liquid source 47a to be discharged from the nozzle 41 toward the top surface of the wafer W being rotated. The etching liquid is discharged from the nozzle 41 after being heated by the heater 45.

Figure 8:
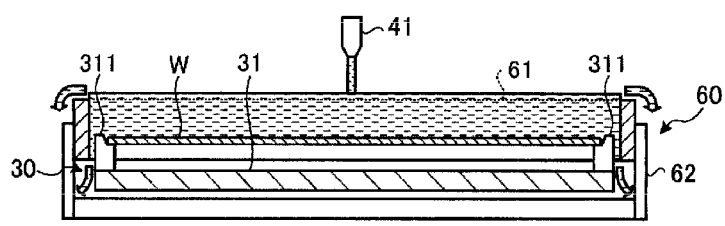
FIG. 8 is an explanatory diagram for describing an operation of the substrate processing according to the first exemplary embodiment.
Figure 8:
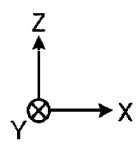

The etching liquid supplied onto the wafer W is diffused onto the entire surface of the wafer W by a centrifugal force generated by the rotation of the wafer W. Then, the etching liquid attempts to flow out from the surface of the wafer W but is blocked by the embankment 61 to stay on the wafer W. Accordingly, as shown in FIG. 8, a thickness of a liquid film of the etching liquid formed on the wafer W can be increased, as compared to a case where the embankment 61 is not provided. Further, the etching liquid is flown out from an upper end of the embankment 61 or a gap between the embankment 61 and the rotary plate 31 little by little, and is drained to the outside of the processing unit 16 through the drain port 51.

As stated above, the temperature of the etching liquid is decreased by the heat absorption into the wafer W or the evaporation heat by evaporation. Among these, the temperature decrease caused by the heat absorption becomes larger at the peripheral portion of the wafer W, as compared to the central portion of the wafer W. That is, the liquid film of the etching liquid at the peripheral portion of the wafer W is thinned as compared to the liquid film of the etching liquid at the central portion of the wafer W by being affected by, for example, the rotation of the wafer W or a surface tension. As a result, a heat storage amount of the liquid film at the peripheral portion of the wafer W gets smaller than a heat storage amount of the liquid film at the central portion of the wafer W. Thus, the temperature decrease at the peripheral portion of the wafer W becomes larger.

In view of this, in the processing unit 16 according to the first exemplary embodiment, the liquid film of the etching liquid formed on the wafer W is thickened by blocking the outflow of the etching liquid from the wafer W with the embankment 61.

As the liquid film of the etching liquid is thickened, the heat storage amount of the liquid film is increased. Thus, even if there is a difference in the thickness of the liquid film between the central portion and the peripheral portion of the wafer W, an influence of this difference upon the temperature of the etching liquid is reduced. That is, a difference in the temperature of the etching liquid between the central portion and the peripheral portion of the wafer W may not be generated.

As stated above, in the processing unit 16 according to the first exemplary embodiment, temperature uniformity of the etching liquid within the surface of the wafer W can be improved. Therefore, the in-surface uniformity of the etching processing can be improved.

Figure 9:
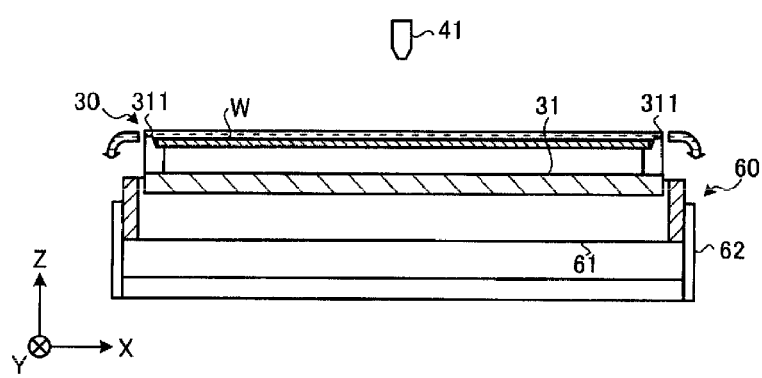
FIG. 9 is an explanatory diagram for describing an operation of the substrate processing according to the first exemplary embodiment.

Upon the completion of the etching processing, the controller 18 controls the moving mechanism 64 to lower the embankment 61 (process S104) in the substrate processing system 1. Accordingly, as shown in FIG. 9, the embankment 61 is located at a position where it does not surround the wafer W, specifically, at the position where the upper end surface thereof is lower than the top surface of the wafer W.

By lowering the embankment 61 after the completion of the etching processing as stated above, a large amount of the etching liquid, which is suppressed from being flown out from the wafer W by the embankment 61, can be flown out from the wafer W in a short time. Accordingly, the processing can proceed to a rinsing processing early.

Figure 10:
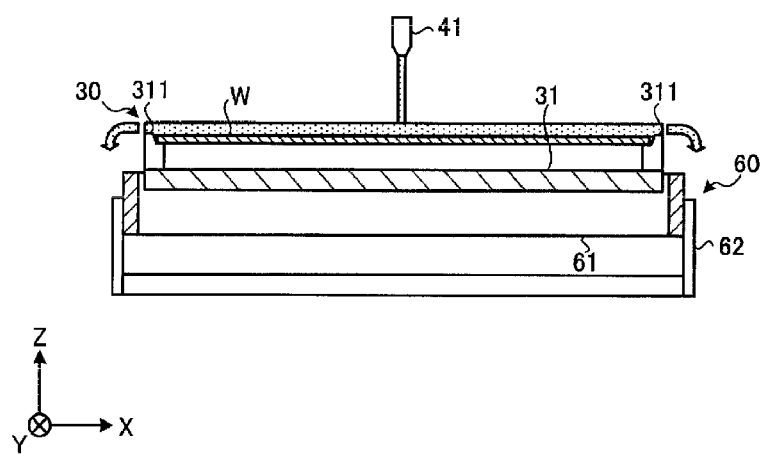
FIG. 10 is an explanatory diagram for describing an operation of the substrate processing according to the first exemplary embodiment.

Then, the rinsing processing is performed in the substrate processing system 1 (process S105). To elaborate, the controller 18 opens the valve 46b for a preset time period, thus allowing the rinse liquid supplied from the rinse liquid source 47b to be discharged from the nozzle 41 toward the central portion of the wafer W being rotated. The rinse liquid discharged onto the top surface of the wafer W is diffused from the central portion of the wafer W toward the peripheral portion thereof by the centrifugal force generated by the rotation of the wafer W. Accordingly, as shown in FIG. 10, the etching liquid remaining on the top surface of the wafer W is washed away by the rinse liquid.

Figure 11:
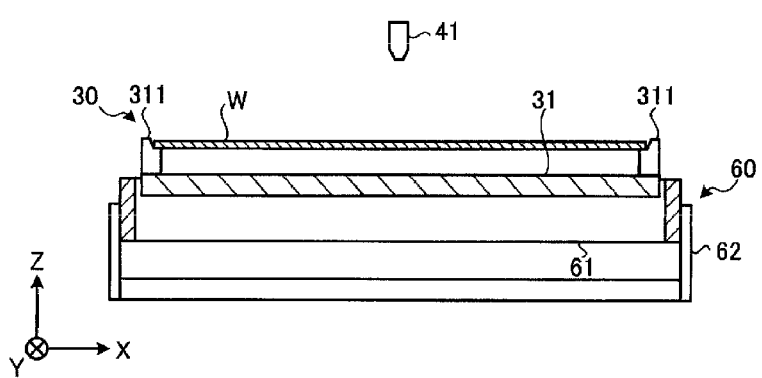
FIG. 11 is an explanatory diagram for describing an operation of the substrate processing according to the first exemplary embodiment.

Thereafter, in the substrate processing system 1, a drying processing is performed (process S106). To elaborate, the controller 18 controls the driving unit 33 to increase a rotation number of the wafer W. Accordingly, as illustrated in FIG. 11, the rinse liquid remaining on the wafer W is removed, so that the wafer W is dried. Then, the controller 18 controls the driving unit 33 to stop the rotation of the wafer W.

Subsequently, a carry-out processing is performed in the substrate processing system 1 (process S107). In the carry-out processing, the wafer W after being subjected to the drying processing is taken out from the processing unit 16 and placed on the delivery unit 14 by the substrate transfer device 17. Then, the wafer W placed on the delivery unit 14 is returned back into the carrier C in the carrier placing section 11 by the substrate transfer device 13. As a result, a series of substrate processings upon the single sheet of wafer W is completed.

Desirably, the height of the embankment 61 is set to allow the liquid film of the etching liquid formed on the wafer W to have an enough thickness not to be affected by the heat absorption or the evaporation heat. However, the degree of the influence of the evaporation heat upon the temperature of the etching liquid may differ depending on a property of the etching liquid. For example, the degree of the influence of the evaporation heat upon the temperature of the etching liquid may be increased as the etching liquid has a lower boiling point.

Thus, in the process S102, the controller 18 may adjust the height of the embankment 61 based on the kind of the etching liquid. In such a case, the control device 4 may store, in the storage 19 in advance, height setting information in which the kind of the etching liquid and the height of the embankment 61 are matched with each other. The controller 18 specifies the kind of the etching liquid from recipe information indicating a content of the substrate processing, and specifies the height of the embankment 61 matched with this specified kind of the etching liquid from the height setting information stored in the storage 19. Then, the controller 18 controls the moving mechanism 64 to raise the embankment 61 such that the embankment 61 reaches the specified height.

As stated above, the height of the embankment 61 may be adjusted based on the kind of the etching liquid. To elaborate, the higher the boiling point of the etching liquid is, the higher the height of the embankment 61 may be. Accordingly, the temperature decrease of the etching liquid caused by the evaporation heat may be suppressed appropriately.

Further, the degree of the influence of the evaporation heat upon the temperature of the etching liquid may differ depending on a heating temperature of the etching liquid. By way of example, the degree of the influence of the evaporation heat upon the temperature of the etching liquid may be increased with a rise of the heating temperature of the etching liquid.

Accordingly, in the process S102, the controller 18 may adjust the height of the embankment 61 based on the heating temperature of the etching liquid. In such a case, the control device 4 may store, in the storage 19 in advance, height setting information in which the heating temperature of the etching liquid and the height of the embankment 61 are matched with each other. The controller 18 specifies the heating temperature of the etching liquid from the recipe information indicating the content of the substrate processing, and specifies the height of the embankment 61 matched with this specified heating temperature of the etching liquid from the height setting information stored in the storage 19. Then, the controller 18 controls the moving mechanism 64 to raise the embankment 61 such that the embankment 61 reaches the specified height.

As stated above, the height of the embankment 61 may be adjusted based on the heating temperature of the etching liquid. To elaborate, when the heating temperature of the etching liquid is high, the height of the embankment 61 may be set to be high, as compared to a case where the heating temperature of the etching liquid is low. Accordingly, the temperature decrease of the etching liquid caused by the evaporation heat may be suppressed appropriately.

Further, after the etching liquid is flown out from the top surface of the wafer W by lowering the embankment 61 in the process S104, the controller 18 may raise the embankment 61 before the rinsing processing of the process S105 is begun. That is, the controller 18 may perform the rinsing processing in the state that the wafer W is surrounded by the embankment 61. Accordingly, the etching liquid adhering to the embankment 61 can be washed away by the rinse liquid.

Furthermore, the present exemplary embodiment has been described for the example where the etching liquid is overflown from the upper end of the embankment 61. However, the exemplary embodiment is not limited thereto. For example, after the etching liquid is stored, the controller 18 may control the flow rate controller 44a to decrease a flow rate of the etching liquid discharged from the nozzle 41 such that the flow rate of the etching liquid discharged from the nozzle 41 becomes equal to a flow rate of the etching liquid flown out from the gap between the embankment 61 and the rotary plate 31. Thus, consumption of the etching liquid can be suppressed.

In addition, the controller 18 may stop the supply of the etching liquid from the nozzle 41 by closing the valve 46a before the etching processing is ended. Even if the supply of the etching liquid is stopped before the completion of the etching processing, the wafer W can be still etched by the etching liquid stored on the wafer W. Thus, the consumption of the etching liquid can be suppressed.

Second Exemplary Embodiment

Depending on the wafer W, a film thickness of a film to be removed by the etching processing may not be uniform. By way of example, the film thickness at the peripheral portion of the wafer W may be thicker than the film thickness at the central portion thereof, or the film thickness at the central portion of the wafer W may be thicker than the film thickness at the peripheral portion thereof.

In view of this, in the substrate processing system 1, a partial etching processing of uniformizing the film thickness of the film formed on the top surface of the wafer W may be performed before the etching processing is performed.

Figure 12:
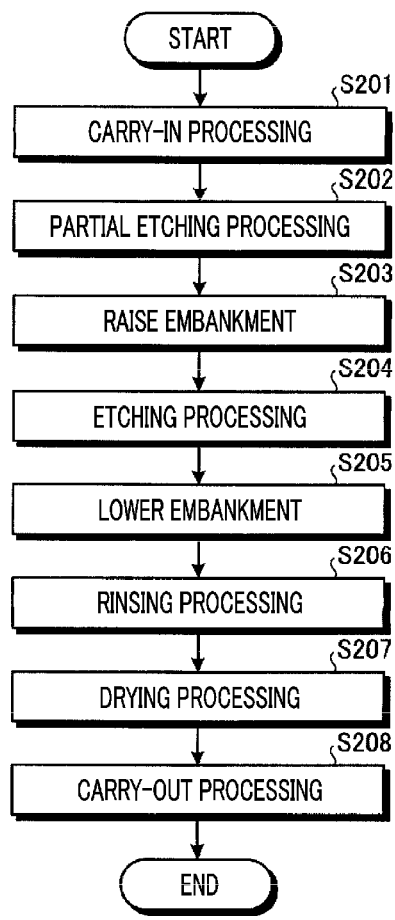
FIG. 12 is a flowchart illustrating a sequence of a substrate processing performed by a substrate processing system according to a second exemplary embodiment.
Figure 13:
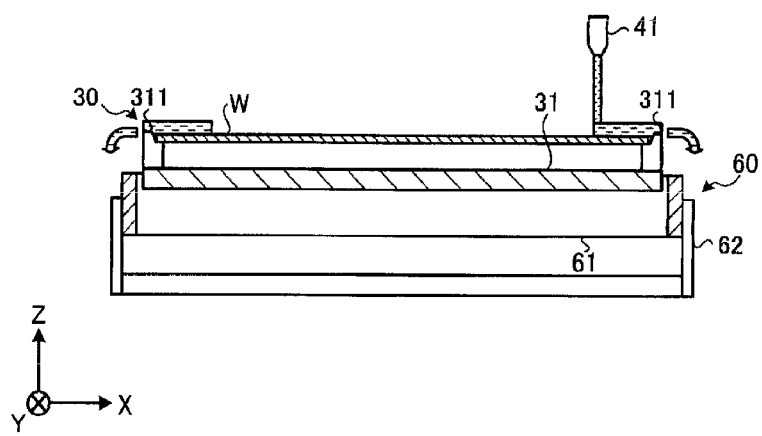
FIG. 13 is an explanatory diagram for describing an operation of a partial etching processing upon a wafer where a film thickness at a peripheral portion is larger than a film thickness at a central portion.
Figure 14:
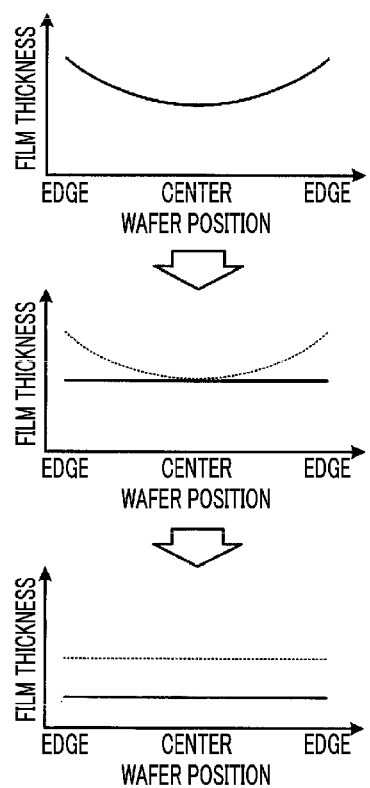
FIG. 14 is a diagram illustrating a variation of the film thickness while performing the partial etching processing and an etching processing upon the wafer where the film thickness at the peripheral portion is larger than the film thickness at the central portion.
Figure 15:
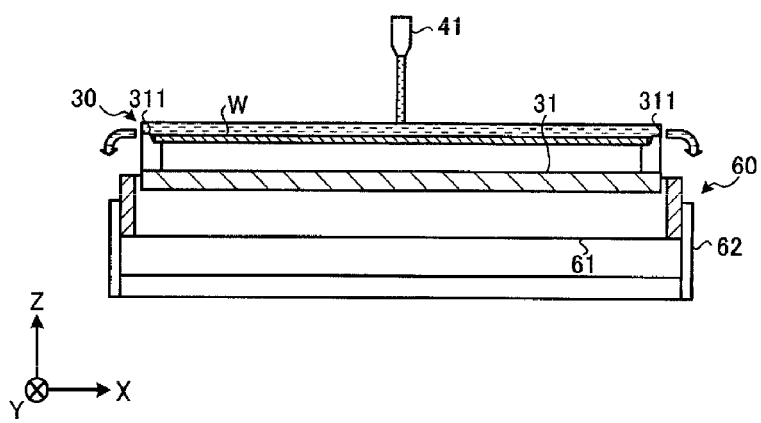
FIG. 15 is an explanatory diagram for describing an operation of a partial etching processing upon a wafer where a film thickness at a central portion is larger than a film thickness at a peripheral portion.
Figure 16:
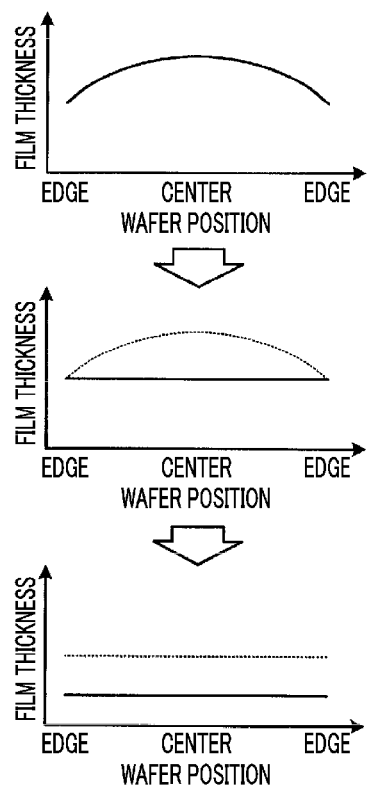
FIG. 16 is a diagram illustrating a variation of the film thickness while performing the partial etching processing and an etching processing upon the wafer where the film thickness at the central portion is larger than the film thickness at the peripheral portion.

This will be explained with reference to FIG. 12 to FIG. 16. FIG. 12 is a flowchart illustrating a sequence of a substrate processing performed by a substrate processing system 1 according to a second exemplary embodiment. FIG. 13 is an explanatory diagram for describing an operation of a partial etching processing upon the wafer W in case that the film thickness at the peripheral portion of the wafer W is larger than the film thickness at the central portion thereof. FIG. 14 is a diagram showing a variation of the film thickness caused by the partial etching processing and an etching processing performed on the same wafer W. Further, FIG. 15 is an explanatory diagram for describing an operation of a partial etching processing upon the wafer W in case that the film thickness at the central portion of the wafer W is larger than the film thickness at the peripheral portion thereof. FIG. 16 is a diagram showing a variation of the film thickness caused by the partial etching processing and an etching processing performed on the same wafer W.

Processings of processes S201 and S203 to S208 shown in FIG. 12 are the same as the processings of the processes S101 to S107 described in FIG. 5. In the substrate processing system 1 according to the second exemplary embodiment, after the wafer W is carried into the processing unit 16 in the process S201, a partial etching processing is performed (process S202) before the embankment 61 is raised in the process S203.

In the partial etching processing, an etching liquid is supplied to a part of the wafer W, particularly, a portion of the wafer W having a relatively large film thickness, in a state that the embankment 61 is lowered, that is, in a state that an outflow of the etching liquid from the wafer W is not blocked.

By way of example, as shown in the upper part of FIG. 14, if a film is formed on the wafer W and a film thickness at a peripheral portion of the wafer W is thicker than a film thickness at a central portion thereof, the controller 18 controls the rotating/elevating mechanism 43 to locate the nozzle 41 at a position above the peripheral portion of the wafer W, as shown in FIG. 13. Then, the controller 18 opens the valve 46a, thus allowing the etching liquid to be supplied onto the peripheral portion of the wafer W from the nozzle 41. The etching liquid supplied onto the peripheral portion of the wafer W flows outwards by a centrifugal force generated by rotation of the wafer W. Therefore, the etching liquid is not supplied to the central portion of the wafer W. In this way, since the etching liquid is supplied only to the peripheral portion of the wafer W, only the film formed on the peripheral portion of the wafer W is removed. Accordingly, as shown in the middle part of FIG. 14, the film thickness of the film formed on the top surface of the wafer W can be uniformed, as compared to a case before the partial etching processing is begun. Thereafter, in the substrate processing system 1, an etching processing is performed in a state that the embankment 61 is raised (process S204). As a result, the film formed on the top surface of the wafer W is uniformly removed, as illustrated in the lower part of FIG. 14.

Further, as shown in the upper part of FIG. 16, for example, if a film is formed on the wafer W and a film thickness at the central portion of the wafer W is thicker than a film thickness at the peripheral portion thereof, the controller 18 controls the rotating/elevating mechanism 43 to locate the nozzle 41 at a position above the central portion of the wafer W, as shown in FIG. 15. Then, the controller 18 opens the valve 46a, thus allowing the etching liquid to be supplied onto the central portion of the wafer W from the nozzle 41. The etching liquid supplied onto the central portion of the wafer W is diffused onto the entire surface of the wafer W by the centrifugal force generated by the rotation of the wafer W. Here, in a state that the embankment 61 is not raised, an etching amount at the peripheral portion of the wafer W is reduced as compared to an etching amount at the central portion thereof, as stated above. Accordingly, the film formed at the central portion of the wafer W is removed more than the film formed on the peripheral portion thereof. As a result, as depicted in the middle part of FIG. 16, the film thickness of the film formed on the top surface of the wafer W can be uniformed, as compared to the case before the partial etching processing is begun. Thereafter, in the substrate processing system 1, an etching processing is performed in a state that the embankment 61 is raised (process S204). As a result, the film formed on the top surface of the wafer W is uniformly removed, as illustrated in the lower part of FIG. 16.

As stated above, the partial etching processing of supplying the etching liquid to a part of the wafer W may be performed before the embankment 61 is raised after the carry-in processing. Through the partial etching processing, not only the in-surface uniformity of the substrate processing but the uniformity of the film thickness obtained after the substrate processing can also be improved.

Further, the controller 18 may acquire film thickness information upon the film thickness of the film formed on the wafer W in advance, and control the rotating/elevating mechanism 43 based on the film thickness information to move the nozzle 41 to a position above a portion of the top surface of the wafer W where the film thickness is larger as compared to the other portion of the top surface of the wafer W. A film thickness measurer configured to measure the film thickness of the film formed on the wafer W may be disposed within the substrate processing system 1 or at an outside of the substrate processing system 1.

Third Exemplary Embodiment

Figure 17:
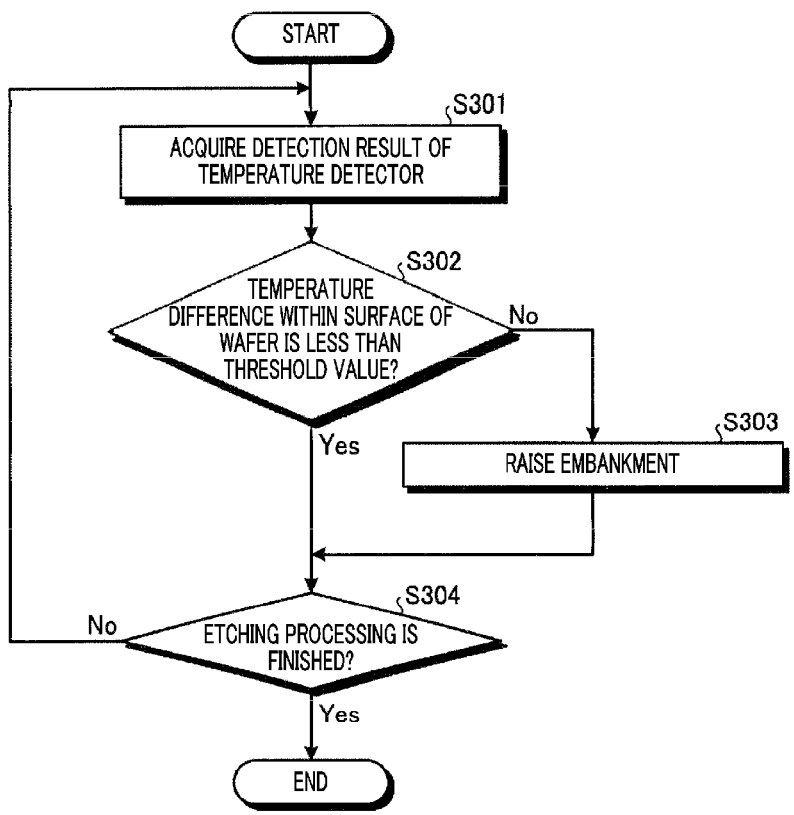
FIG. 17 is a flowchart illustrating a sequence of a height adjusting processing according to a third exemplary embodiment.

For example, if the height of the embankment 61 is not sufficient, the temperature of the etching liquid may not be uniform within the surface of the wafer W. Thus, the controller 18 may adjust the height of the embankment 61 based on a temperature distribution within the surface of the wafer W during the etching processing. This will be explained with reference to FIG. 17. FIG. 17 is a flowchart illustrating a sequence of a height adjusting processing according to a third exemplary embodiment. For example, the height adjusting processing shown in FIG. 17 is set to be begun in a case that the etching processing is begun.

As depicted in FIG. 17, the controller 18 first acquires a detection result of the temperature detector 70 (see FIG. 2) (process S301). As stated above, the temperature detector 70 detects the temperature of the entire top surface of the wafer W. Accordingly, the detection result of the temperature detector 70 indicates the temperature distribution within the surface of the wafer W. Then, based on the detection result of the temperature detector 70, the controller 18 determines whether a temperature difference within the surface of the wafer W is less than a threshold value (process S302).

If it is determined in the process S302 that the temperature difference within the surface of the wafer W exceeds the threshold value (process S302, No), the controller 18 controls the moving mechanism 64 to raise the embankment 61 (process S303). A raising amount of the embankment 61 at this time may be a preset amount. Further, height adjustment information in which the temperature difference within the surface of the wafer W and the raising amount of the embankment 61 are matched with each other may be previously stored in the storage 19, and the controller 18 may decide the raising amount of the embankment 61 based on this height adjustment information.

Upon the completion of the process S303 or if it is determined in the process S302 that the temperature difference within the surface of the wafer W is less than the threshold value (process S302, Yes), the controller 18 determines whether the etching processing is finished (process S304). In this processing, if the etching processing is not ended (process S304, No), the controller 18 returns the processing back to the process S301. Meanwhile, if the etching processing is completed (process S304, Yes), the controller 18 ends the height adjusting processing.

As stated above, the controller 18 may adjust the height of the embankment 61 by controlling the moving mechanism 64 based on the temperature distribution within the surface of the wafer W which is detected by the temperature detector 70. Accordingly, in case that there is non-uniformity in the temperature distribution within the surface of the wafer W, such non-uniformity can be reduced by increasing the height of the embankment 61. That is, in-surface uniformity of the temperature of the etching liquid can be improved. Therefore, in-surface uniformity of the substrate processing can be bettered.

Fourth Exemplary Embodiment

Figure 18:
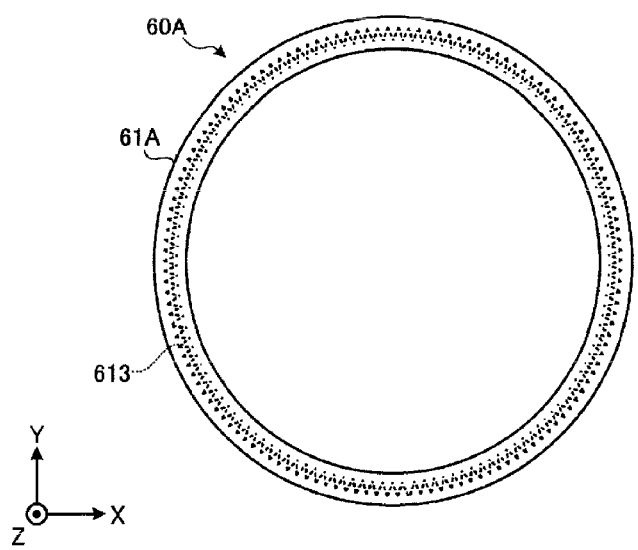
FIG. 18 is a diagram illustrating a configuration of an embankment mechanism according to a first modification example of a fourth exemplary embodiment.

In a fourth exemplary embodiment, a modification example of the embankment mechanism will be explained. FIG. 18 is a diagram illustrating a configuration of an embankment mechanism according to a first modification example of a fourth exemplary embodiment.

As depicted in FIG. 18, an embankment mechanism 60A according to the first modification example includes a heater 613 within an embankment 61A. The heater 613 is provided along the entire circumference of the embankment 61A to heat the embankment 61A along the entire circumference thereof. In the etching processing, the controller 18 controls the heater 613 to heat the embankment 61A such that a temperature of the embankment 61A becomes equal to a temperature of the etching liquid supplied onto the wafer W. Accordingly, since a temperature decrease of the etching liquid caused by heat absorption into the embankment 61A is suppressed, in-surface uniformity of the temperature of the etching liquid can be improved. Therefore, in-surface uniformity of the substrate processing can be improved.

Further, the heater 613 need not necessarily be provided along the entire circumference of the embankment 61A. By way of example, the embankment 61A may incorporate therein a plurality of heaters arranged at a regular distance therebetween along the circumference of the embankment 61A. Furthermore, the controller 18 need not necessarily control the temperature of the embankment 61A to be equal to the temperature of the etching liquid. By way of example, the controller 18 may control the heater 613 such that the temperature of the embankment 61A becomes higher than the temperature of the etching liquid. In this case, the temperature of the etching liquid at a peripheral portion of a wafer W can be set to be higher than the temperature of the etching liquid at a central portion of the wafer W. Accordingly, a film thickness on the wafer W, which is larger at the peripheral portion of the wafer W than at the central portion thereof, can be uniformed without performing the partial etching processing according to the second exemplary embodiment.

Figure 19:
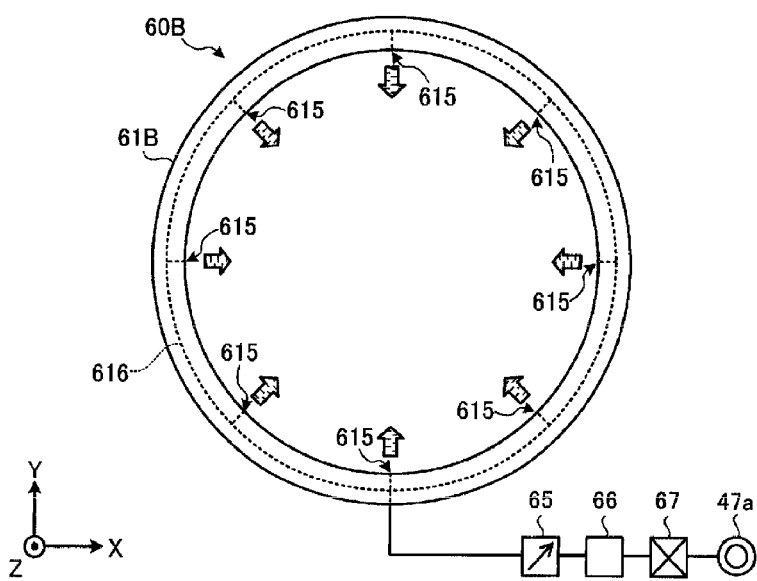
FIG. 19 is a diagram illustrating a configuration of an embankment mechanism according to a second modification example of the fourth exemplary embodiment.

FIG. 19 is a diagram illustrating a configuration of an embankment mechanism according to a second modification example of the fourth exemplary embodiment. As shown in FIG. 19, an embankment 61B of an embankment mechanism 60B according to the second modification example has, at an inner circumferential surface thereof, a plurality of discharge openings 615 through which the etching liquid is discharged. These discharge openings 615 are arranged at a regular distance therebetween along the circumference of the embankment 61B. Further, the embankment 61B has therein a supply path 616 through which the etching liquid is supplied to the plurality of discharge openings 615. For example, the supply path 616 is provided along the entire circumference of the embankment 61B. The supply path 616 is connected to the etching liquid source 47a via a flow rate controller 65, a heater 66 and a valve 67.

The etching liquid supplied from the etching liquid source 47a is heated by the heater 66 to a temperature equal to a temperature of the etching liquid supplied from the nozzle 41, for example, and is then supplied to the peripheral portion of the wafer W from the plurality of discharge openings 615.

In the etching processing, the controller 18 opens the valve 46a and the valve 67 to thereby perform the supply of the etching liquid to the central portion of the wafer W from the nozzle 41 and the supply of the etching liquid to the peripheral portion of the wafer W from the plurality of discharge openings 615.

In the etching processing, there is generated a time lag until the etching liquid supplied to the central portion of the wafer W from the nozzle 41 reaches the peripheral portion of the wafer W. As a result, due to this time lag, there may be generated a difference between an etching amount at the central portion of the wafer W and an etching amount at the peripheral portion of the wafer W.

However, by supplying the etching liquid from the embankment 61B as well as from the nozzle 41 as in the second modification example, the etching liquid can be collected on the wafer W in a shorter time, as compared to a case where the etching liquid is supplied only from the nozzle 41. Accordingly, deterioration of in-surface uniformity of the substrate processing which may occur before the etching liquid is collected on the wafer W can be suppressed. Further, by performing the supply of the etching liquid to the central portion of the wafer W and the supply of the etching liquid to the peripheral portion of the wafer W, the difference between the etching amount at the central portion of the wafer W and the etching amount at the peripheral portion thereof may be suppressed.

Further, since the heated etching liquid flows in the supply path 616, the embankment 61B can be heated. Accordingly, the same as the embankment 61A according to the first modification example, a temperature decrease of the etching liquid caused by heat absorption into the embankment 61B can be suppressed.

Furthermore, upon a lapse of a preset time after the etching processing is begun, the controller 18 may close the valve 67 to stop only the supply of the etching liquid from the embankment 61B. For example, before the etching liquid is overflown from an upper end of the embankment 61B after the etching processing is begun, the controller 18 may stop the supply of the etching liquid from the embankment 61B.

The way how to collect the etching liquid on the wafer W in a short time may not be limited to the above-described example. By way of example, during a period after the etching processing is begun and before the etching liquid is overflown from the upper end of the embankment 61B, the controller 18 may discharge the etching liquid from the nozzle 41 at a first flow rate and, then, may discharge the etching liquid from the nozzle 41 at a second flow rate smaller than the first flow rate. By discharging the etching liquid from the nozzle 41 at the large flow rate until the etching liquid is collected on the wafer W, the etching liquid can be collected on the wafer W in a short time.

Further, the controller 18 may control the rotating/elevating mechanism 43 to move the nozzle 41 continuously between the central portion and the peripheral portion of the wafer W during the period before the etching liquid is overflown from the upper end of the embankment 61B after the etching processing is begun. Accordingly, the non-uniformity between the etching amount at the central portion of the wafer W and the etching amount at the peripheral portion of the wafer W can be suppressed.

A nozzle (bar nozzle) provided with a multiple number of discharge openings in a diametrical direction of the wafer W may be provided at the arm 42, and the etching liquid may be discharged to multiple positions including the central portion and the peripheral portion of the wafer W at the same time. Accordingly, the etching liquid can be collected on the wafer W early, and the non-uniformity between the etching amount at the central portion and the etching amount at the peripheral portion of the wafer W can be suppressed. This effect can also be achieved by adopting a configuration in which a plurality of supplies 40 is provided, and the etching liquid is supplied, at the same time, to multiple positions including the central portion and the peripheral portion of the wafer W from nozzles 41 of the respective supplies 40.

Further, the controller 18 may control the driving unit 33 to rotate the wafer W at a first rotation number during a period until the etching liquid is diffused onto the entire surface of the wafer W after the etching processing is begun, and, then, control the driving unit 33 to rotate the wafer W at a second rotation number smaller than the first rotation number. By rotating the wafer W at the high speed, the etching liquid can be diffused onto the entire surface of the wafer W early. Therefore, the non-uniformity between the etching amount at the central portion and the etching amount at the peripheral portion of the wafer W can be suppressed.

Figure 20:
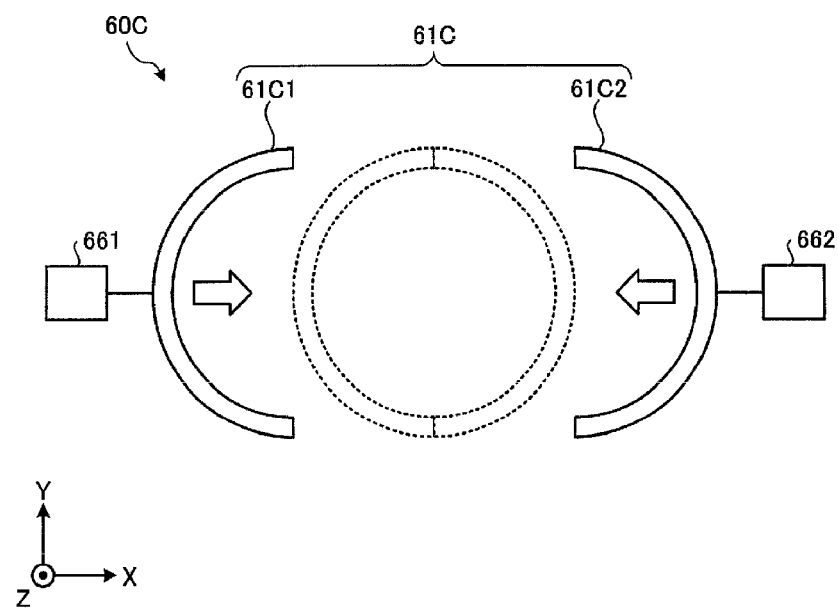
FIG. 20 is a diagram illustrating a configuration of an embankment mechanism according to a third modification example of the fourth exemplary embodiment.

FIG. 20 is a diagram illustrating a configuration of an embankment mechanism according to a third modification example of the fourth exemplary embodiment. As depicted in FIG. 20, an embankment 61C of an embankment mechanism 60C according to the third modification example is equipped with a plurality of (here, two) division bodies 61C1 and 61C2. Each of the division bodies 61C1 and 61C2 has a semicircular shape when viewed from the top. Further, the embankment mechanism 60C is equipped with a division body moving mechanism 661 configured to move the division body 61C1 and a division body moving mechanism 662 configured to move the division body 61C2. The division body moving mechanisms 661 and 662 move the division bodies 61C1 and 61C2 between a state where the division bodies 61C1 and 61C2 are joined to form the embankment 61C having a cylindrical shape and a state where the embankment 61C is divided into the division bodies 61C1 and 61C2. In the state that the embankment 61C is divided into the multiple division bodies 61C1 and 61C2, the multiple division bodies 61C1 and 61C2 are disposed at positions where they do not interfere with the wafer W when the wafer W is carried in or out, for example. Accordingly, the wafer W can be suppressed from being hampered by the embankment 61C when the wafer W is carried in or out.

Other Exemplary Embodiments

The embankment mechanism 60 (60A to 60C) may include a rotating mechanism configured to rotate the supporting column 63 (see FIG. 2). In this case, by rotating the supporting column 63 with the rotating mechanism, the embankment mechanism 60 (60A to 60C) is capable of rotating the embankment 61 (61A to 61C) around the same rotation axis as the rotation axis of the wafer W.

Further, in this case, the controller 18 may rotate the embankment 61 (61A to 61C) in the same direction as the rotational direction of the wafer W in the etching processing, for example. Accordingly, scattering of the etching liquid can be suppressed, for example. Furthermore, in the etching processing, the controller 18 may rotate the embankment 61 (61A to 61C) in the reverse direction as the rotational direction of the wafer W, for example. Accordingly, the flow of the etching liquid near an outer peripheral portion of the wafer W may be disturbed, so that the etching amount at the peripheral portion of the wafer W can be increased, as compared to the etching amount at the central portion of the wafer W.

In the above-described exemplary embodiments, the etching liquid is used as an example of the processing liquid. However, the processing liquid is not limited to the etching liquid. By way of example, the processing liquid may be a chemical liquid such as SC1 (a mixed solution of ammonia/hydrogen peroxide/water) or SC2 (a mixed solution of hydrochloric acid/hydrogen peroxide/water) for use in removing particles. Further, the processing liquid may be an organic solvent such as IPA (isopropyl alcohol) for use in the drying processing.

As stated above, the substrate processing apparatus according to the exemplary embodiments (as an example, the processing unit 16) includes a placing unit (as an example, the rotary plate 31), the supply 40, the embankment 61 (61A to 61C) and the moving mechanism 64. The placing unit places a substrate (as an example, the wafer W) thereon. The supply 40 supplies a processing liquid (as an example, the etching liquid) onto the substrate placed on the placing unit. The embankment 61 (61A to 61C) surrounds the substrate placed on the placing unit and suppresses an outflow of the processing liquid supplied onto the substrate from the substrate. The moving mechanism 64 changes a height of the embankment.

As the outflow of the processing liquid supplied onto the substrate from the substrate can be blocked by the embankment 61 (61A to 61C), the liquid film of the processing liquid formed on the substrate can be thickened. Accordingly, since there may not be generated the difference between the temperature of the processing liquid at the central portion of the substrate and the temperature of the processing liquid at the peripheral portion of the substrate, the temperature uniformity of the processing liquid within the surface of the substrate can be improved. Therefore, in the substrate processing apparatus according to the exemplary embodiments, the in-surface uniformity of the substrate processing can be improved.

Further, the embankment may include the first member 611 in contact with the processing liquid supplied onto the substrate and the second member 612 provided at an outer peripheral side than the first member 611. In this configuration, the first member 611 may be made of a material having the thermal conductivity higher than that of the second member 612.

As the first member 611 is made of the material having the high thermal conductivity, the temperature of the first member 611 which comes into contact with the processing liquid can be made to approach the temperature of the processing liquid early. Accordingly, it is possible to suppress the difference between the temperature of the processing liquid at the peripheral portion of the substrate and the temperature of the processing liquid at the central portion of the substrate, which may be caused if a state in which the temperature of the first member 611 is lower than the temperature of the processing liquid lasts longer. Further, by using the second member 612 having the low thermal conductivity, the heat of the embankment 61 heated by the processing liquid can be suppressed from being released to the atmosphere. Accordingly, the generation of the difference between the temperature of the processing liquid at the peripheral portion of the substrate and the temperature of the processing liquid at the central portion of the substrate due to the temperature decrease of the embankment 61 can be suppressed.

Moreover, the substrate processing apparatus according to the exemplary embodiment may be equipped with the heater 613 configured to heat the embankment 61A. With this configuration, since the temperature decrease of the processing liquid caused by the heat absorption into the embankment 61A is suppressed, the in-surface uniformity of the temperature of the processing liquid can be improved. Therefore, the in-surface uniformity of the substrate processing can be further improved.

In addition, the embankment 61B may have, at an inner peripheral surface thereof, the plurality of discharge openings 615 through which the processing liquid is discharged. By supplying the processing liquid from the embankment 61B as well as from the supply 40, the processing liquid can be collected on the substrate in a short time, as compared to the case where the processing liquid is supplied only from the supply 40. Therefore, the deterioration of the in-surface uniformity of the substrate processing, which might occur before the processing liquid is collected on the substrate, can be suppressed.

Besides, the substrate processing apparatus according to the exemplary embodiment may be further equipped with the controller 18 configured to control the moving mechanism 64. In this case, the controller 18 may adjust the height of the embankment 61 (61A to 61C) based on the kind of the processing liquid by controlling the moving mechanism 64. Thus, the temperature decrease of the processing liquid caused by the evaporation heat can be appropriately suppressed.

Furthermore, the substrate processing apparatus according to the exemplary embodiment may be further equipped with the controller 18 configured to control the moving mechanism 64. In this case, the controller 18 may adjust the height of the embankment 61 (61A to 61C) based on the temperature of the processing liquid by controlling the moving mechanism 64. To elaborate, in case that the temperature of the processing liquid is high, the controller 18 may set the height of the embankment 61 (61A to 61C) to be high, as compared to a case where the temperature of the processing liquid is low. As a result, the temperature decrease of the processing liquid caused by the evaporation heat can be appropriately suppressed.

Moreover, the substrate processing apparatus according to the exemplary embodiment may be further equipped with the controller 18 configured to control the moving mechanism 64; and the temperature detector 70 configured to detect a temperature of the substrate within the surface thereof. In this case, while the processing liquid is being supplied from the supply 40 onto the substrate placed on the placing unit, the controller 18 may adjust the height of the embankment 61 (61A to 61C) by controlling the moving mechanism 64 based on a temperature distribution of the substrate within the surface thereof, which is detected by the temperature detector 70.

Thus, even if the temperature distribution of the substrate within the surface thereof is non-uniform, such non-uniformity can be reduced by setting the height of the embankment 61 (61A to 61C) to be high. That is, the in-surface uniformity of the temperature of the processing liquid can be improved. Therefore, the in-surface uniformity of the substrate processing can be bettered.

Moreover, in the substrate processing apparatuses according to the exemplary embodiments, a partial supplying process (as an example, the partial etching processing of the process S202) may be performed. The partial supplying process is performed to supply the processing liquid to a part of the substrate after a placing process (as an example, the carry-in processing of the process S101 (S201)) and before a surrounding process (as an example, the processing of raising the embankment 61 (61A to 61C) in the process S102 (S203)). Accordingly, while improving the in-surface uniformity of the substrate processing, it is possible to improve the uniformity of the film thickness after the substrate processing.

In addition, in the substrate processing apparatuses according to the exemplary embodiments, a flowing-out process (as an example, the processing of lowering the embankment 61 (61A to 61C) in the process S104 (S205)) and a rinsing process (as an example, the rinsing processing of the process 105 (S206)) may be performed. In the flowing-out process, the processing liquid is flown out from the substrate by moving, after a supplying process (as an example, the etching processing of the process S103 (S204)), the embankment 61 (61A to 61C) to the position where the embankment 61 (61A to 61C) does not block the outflow of the processing liquid from the substrate. In the rinsing process, after the flowing-out process, the rinse liquid is supplied onto the substrate placed on the placing unit.

As stated above, by lowering the embankment 61 after the completion of the supplying process, a large amount of the processing liquid suppressed from being flown out from the substrate by the embankment 61 can be flown out from the substrate in a short time. Therefore, the processing can proceed to the rinsing process early.

Furthermore, in the substrate processing apparatuses according to the exemplary embodiments, a re-surrounding process of surrounding the substrate placed on the placing unit by the embankment 61 (61A to 61C) may be performed by moving the embankment 61 (61A to 61C) after the flowing-out process and before the rinsing process. Accordingly, the processing liquid adhering to the embankment 61 can be washed away by the rinse liquid.

Moreover, in the above-described various exemplary embodiments, the heated etching liquid is used as an example of the processing liquid. However, the processing liquid need not necessarily be heated. That is, the processing liquid may be of a room temperature.

According to the exemplary embodiment, it is possible to improve in-surface uniformity of a substrate processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a placing unit configured to place a substrate thereon;
a supply configured to supply a processing liquid onto the substrate placed on the placing unit;
an embankment disposed to surround the substrate placed on the placing unit to suppress an outflow of the processing liquid supplied onto the substrate from the substrate;
a moving mechanism configured to vary a height of the embankment; and
a controller configured to control the moving mechanism,
wherein the controller adjusts, by controlling the moving mechanism, the height of the embankment to a height based on a kind of the processing liquid.

2. The substrate processing apparatus of claim 1,
wherein the embankment comprises:
a first member configured to come into contact with the processing liquid supplied onto the substrate; and
a second member provided at an outer peripheral side than the first member, and
the first member has a higher thermal conductivity than the second member.

3. The substrate processing apparatus of claim 2, further comprising:
a heater configured to heat the embankment.

4. The substrate processing apparatus of claim 2,
wherein the embankment has, at an inner peripheral surface thereof, multiple discharge openings through which the processing liquid is discharged.

5. The substrate processing apparatus of claim 2,
wherein the controller adjusts, by controlling the moving mechanism, the height of the embankment to a height based on a temperature of the processing liquid.

6. The substrate processing apparatus of claim 2, further comprising:
a temperature detector configured to detect a temperature within a surface of the substrate,
wherein the controller adjusts the height of the embankment by controlling the moving mechanism based on a distribution of the temperature within the surface of the substrate detected by the temperature detector while the processing liquid is being supplied from the supply onto the substrate placed on the placing unit.

7. The substrate processing apparatus of claim 1, further comprising:
a heater configured to heat the embankment.

8. The substrate processing apparatus of claim 7,
wherein the embankment has, at an inner peripheral surface thereof, multiple discharge openings through which the processing liquid is discharged.

9. The substrate processing apparatus of claim 7,
wherein the controller adjusts, by controlling the moving mechanism, the height of the embankment to a height based on a temperature of the processing liquid.

10. The substrate processing apparatus of claim 1,
wherein the embankment has, at an inner peripheral surface thereof, multiple discharge openings through which the processing liquid is discharged.

11. The substrate processing apparatus of claim 1,
wherein the controller adjusts, by controlling the moving mechanism, the height of the embankment to a height based on a temperature of the processing liquid.

12. The substrate processing apparatus of claim 11,
wherein the controller sets the height of the embankment to be high when the temperature of the processing liquid is high, as compared to a case where the temperature of the processing liquid is low.

13. The substrate processing apparatus of claim 1, further comprising:
a temperature detector configured to detect a temperature within a surface of the substrate,
wherein the controller adjusts the height of the embankment by controlling the moving mechanism based on a distribution of the temperature within the surface of the substrate detected by the temperature detector while the processing liquid is being supplied from the supply onto the substrate placed on the placing unit.

14. A substrate processing method, comprising:
placing a substrate on a placing unit of a substrate processing apparatus, the substrate processing apparatus further comprising:
a supply configured to supply a processing liquid onto the substrate;
an embankment disposed to surround the substrate;
a moving mechanism configured to vary a height of the embankment; and
a controller configured to control the moving mechanism;
surrounding, after the placing of the substrate, the substrate placed on the placing unit with the embankment;
supplying, after the surrounding of the substrate, the processing liquid from the supply onto the substrate placed on the placing unit, and blocking an outflow of the processing liquid supplied onto the substrate from the substrate with the embankment; and
adjusting a height of the embankment to a height based on a kind of the processing liquid by the controller controlling the moving mechanism.

15. The substrate processing method of claim 14, further comprising:
partially supplying the processing liquid onto a part of the substrate after the placing of the substrate and before the surrounding of the substrate.

16. The substrate processing method of claim 14, further comprising:
flowing out, after the supplying of the processing liquid, the processing liquid from the substrate by moving the embankment to a position where the embankment does not block an outflow of the processing liquid from the substrate; and
supplying, after the flowing out of the processing liquid from the substrate, a rinse liquid onto the substrate placed on the placing unit.

17. The substrate processing method of claim 16, further comprising:
    re-surrounding the substrate placed on the placing unit with the embankment by moving the embankment after the flowing out of the processing liquid from the substrate and before the supplying of the rinse liquid.

\* \* \* \* \*

UNITED STATES PATENT AND TRADEMARK OFFICE
CERTIFICATE OF CORRECTION

PATENT NO. : 11,211,281 B2
APPLICATION NO. : 16/707051
DATED : December 28, 2021
INVENTOR(S) : Kenji Sekiguchi It is certified that error appears in the above-identified patent and that said Letters Patent is hereby corrected as shown below:

In the Specification

Column 18, Line 39, "105" should be -- S105 --.

Signed and Sealed this
Twenty-third Day of August, 2022

Katherine Kelly Vidal
*Director of the United States Patent and Trademark Office*